United States Patent [19]

Stuart

[11] Patent Number: 4,824,540

[45] Date of Patent: Apr. 25, 1989

[54] METHOD AND APPARATUS FOR MAGNETRON SPUTTERING

[76] Inventor: Robley V. Stuart, 536 63rd Ave. NE., Minneapolis, Minn. 55432

[21] Appl. No.: 184,579

[22] Filed: Apr. 21, 1988

[51] Int. Cl.$^4$ ............................................. C23C 14/34
[52] U.S. Cl. .............................. 204/192.12; 204/298
[58] Field of Search .................. 204/192.12, 298 ME, 204/298 SG, 298 PM, 298 CM, 298 PS

[56] References Cited

U.S. PATENT DOCUMENTS 4,401,539  8/1983  Abe et al. .................. 204/192.13

FOREIGN PATENT DOCUMENTS 0162643  11/1985  European Pat. Off. ............ 204/298
53-72790   6/1978  Japan ................................... 204/298
59-208072 11/1984  Japan ................................... 204/298
61-243171 10/1986  Japan ................................... 204/298
62-17174   1/1987  Japan ................................... 204/298
62-230969 10/1987  Japan ................................... 204/298

Primary Examiner—Aaron Weisstuch
Attorney, Agent, or Firm—Hugh D. Jaeger

[57] ABSTRACT

Magnetron type sputtering apparatus in which the magnetic field is provided by one or more electromagnets powered by an electric current derived from sputtering ion current. The magnetron sputtering source electromagnets are wound, insulated and connected so as to provide that the sputtering ion current, or a portion thereof, passes through the coils and thus powers the electromagnets. Thus, a plurality of electromagnets can be connected in parallel or in series and powered by the sputtering ion current.

9 Claims, 2 Drawing Sheets

METHOD AND APPARATUS FOR MAGNETRON SPUTTERING

BACKGROUND OF THE INVENTION

1. Field of the Invention

The present invention pertains to a method and apparatus for magnetron sputtering and, more particularly, pertains to sputtering of a coating of material on an object such as for decorative coatings.

2. Description of the Prior Art

Sputtering is now a well known branch of technology. Reference is made to the book *Vacuum Technology, Thin Film and Sputtering*, by R. V. Stuart (1983), Academic Press. Magnetron sputtering has become the best known and most often used sputtering technique. The term sputtering refers to the ejection of atoms from a surface as a consequence of ions impacting that surface and, in some manner, imparting enough energy to some surface atoms to overcome binding energies and cause these atoms to be ejected. Sputtering can be used as a method of cleaning a surface by subjecting that surface to ion bombardment, and thus removing contaminated layers from that surface.

Sputtering is most commonly used as a method of depositing coatings onto other surfaces. In the latter use, the object (usually called the target) subjected to ion bombardment is composed of the material to be deposited onto the other surfaces. The items to be coated are placed in locations (with respect to the ion bombarded surface) in which their surfaces will intercept the greatest flux of ejected atoms, and thus be coated.

In magnetron sputtering, magnetic fields are employed to help confine electrons which generate the plasma which is the source of bombarding ions. This confinement greatly increases both the sputtering rate and the system efficiency by minimizing the loss of both ions and ionizing electrons.

The magnetic fields used in magnetron sputtering are most commonly and almost exclusively the fields of permanent magnets, but electromagnets can be used. When electromagnets have been used, the electric current has been supplied by external power supplies.

A. W. D. Gill and E. Kay, *Rev. Sci. Instrum.* 36, 277 (1965).

B. K. Wasa and S. Hayakawa, *Rev. Sci. Instrum.* 40, 693 (1969).

C. N. Hosakawa, T. Tsukada and T. Misumi, *J. Vac. Sci. Technol.* 14, 143 (1977).

The need for a separate, external, protectively insulated power supply for electromagnets to be used in magnetron sputtering is cited as the reason for not normally using electromagnets in this application.

D. R. K. Waits, "Thin Film Processes" (J.L. Vossen and W. Kerns eds), p. 135-36, *Academic Press*, New York, 1978.

If a short circuit would occur, the low voltage power supply would be coupled to the high voltage power supply and would then present a hazard to both personnel and property because of the high voltage danger.

The present invention overcomes the disadvantages of the prior art by providing a method and apparatus in which the electric current required to power the electromagnets is derived from the sputtering ion current. The power is therefore supplied by the sputtering power supply rather than by a separate power supply.

SUMMARY OF THE INVENTION

The general purpose of the present invention is to provide a magnetron sputtering apparatus and method in which the magnetic fields used in magnetron sputtering are those of electromagnets powered by current derived from the sputtering ion current.

The method and apparatus overcomes the need for a separate power supply for the electromagnets, eliminates superfluous electrical feed-throughs, simplifies electrical insulation considerations to almost negligible levels, and eliminates potential hazards to persons and property.

The significant aspect and feature of the present invention is the use of electromagnets to provide the magnetic fields for sputtering, and winding the electromagnets with modifications that require the positive electric current (or a fraction thereof) from the plasma to the sputtering target to pass through the electromagnet coils, and then to the sputtering power supply. Electromagnets wound, insulated, and connected in this manner are thus powered by the sputtering ion current and hence by the magnetron sputtering power supply and therefore do not require a separate power supply. Eliminating the need for a separate electromagnet power supply changes the insulation requirements from the order of 1000 volts, which is difficult to achieve in a coolant environment, to the order of 10 volts, which is simple in almost any environment. The high voltage risk factor too, is thus eliminated. If, as in the prior art, a separate power supply is used to power the electromagnet and the insulation fails, there are great potential risks for both personal injury and property damage. With these risks eliminated, use of electromagnets (instead of permanent magnets) in magnetron sputtering sources becomes practical and, in many cases, preferable. A plurality of electromagnets can be utilized, and the electromagnets can be connected in series or parallel. A series connection of the electromagnets is usually preferable.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DESCRIPTION OF A PREFERRED EMBODIMENT

Figure 1:
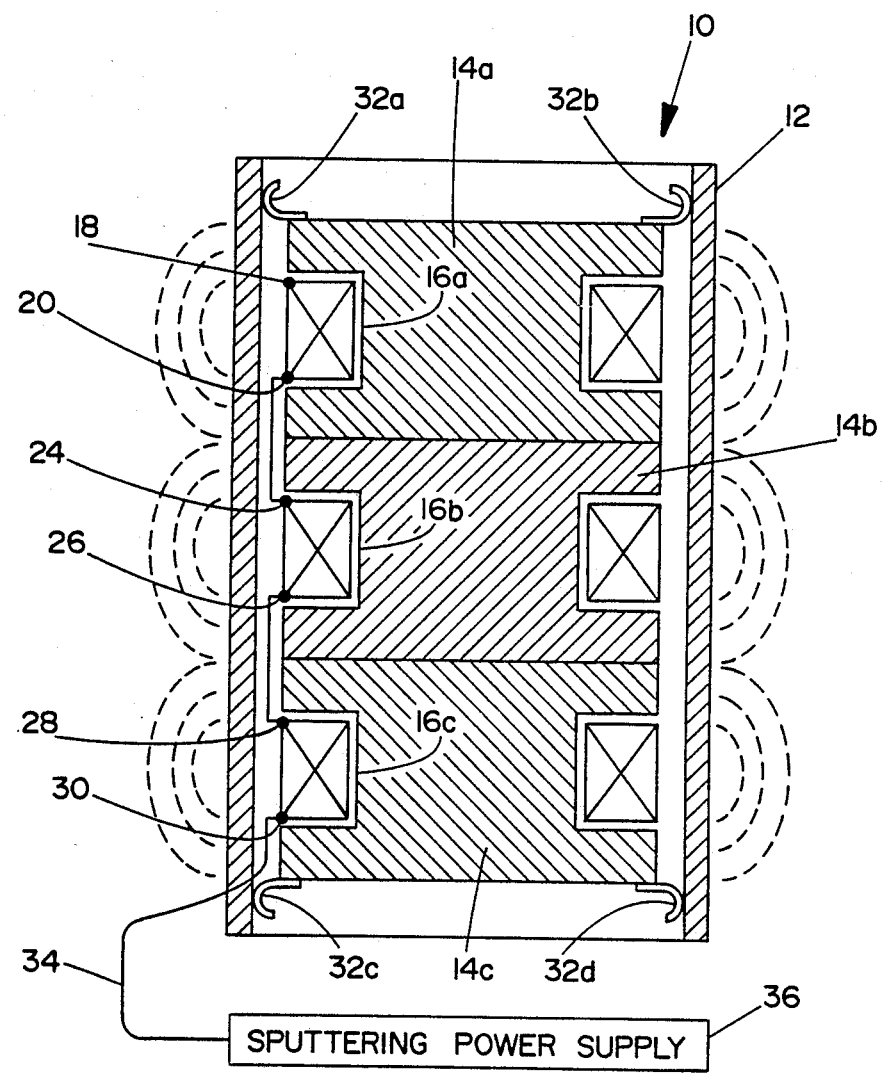
FIG. 1 illustrates a cross-sectional view of a portion of a cylindrical magnetron with electromagnets connected in a series; and, FIG. 2 illustrates a cross-sectional view of a portion of a cylindrical magnetron with the electromagnets connected in parallel.

The operation of this invention can be understood by considering the magnetron sputtering system partially illustrated in FIG. 1. This illustration does not include the vacuum system, power supply, feed throughs, cooling system or other items essential for a sputtering operation, but omitted here for the sake of brevity of this discussion and of the illustrations.

FIG. 1 illustrates a cross-sectional view of a cylindrical magnetron 10. The target, the cylindrical shell 12, is made of a material to be sputtered. The magnet cores 14a-14c are shown here as three separate sections, but could also be machined as a single piece. The number of sections could be from one to the number "n" limited only by the needs and size of the application. An important feature in the system illustrated is that coils of alternative sections are wound in opposite directions; thus, in FIG. 1, coil 16b is wound in the direction opposite to that of coils 16a and 16c. The coil 16a at one end is connected to the magnet core at point 18. The coils are connected in series between points 20-28. The cores 14a-14c are connected to the target 12 through contacts 32a-32d. Wire 34 connects the sputtering power supply 36 to the point 30. The sputtering ion current to the target passes through the contacts 32a-32d, through the cores 14a-14c, through the coil connectors 18-30 of the coils 16a-16c, and thence to the power supply 36. The magnetic field(s) generated are substantially like and similar to those represented by the magnetic field lines sketched in FIG. 1, and, together with the target surface, form tunnel-like channels circling the target 12 which confine the ionizing electrons to close proximity of the target in the manner discussed by U.S. Pat. Nos. 3,878,085, J. F. Corbani, (1975) and 4,166,018, J. S. Chapin (1979).

Figure 2:
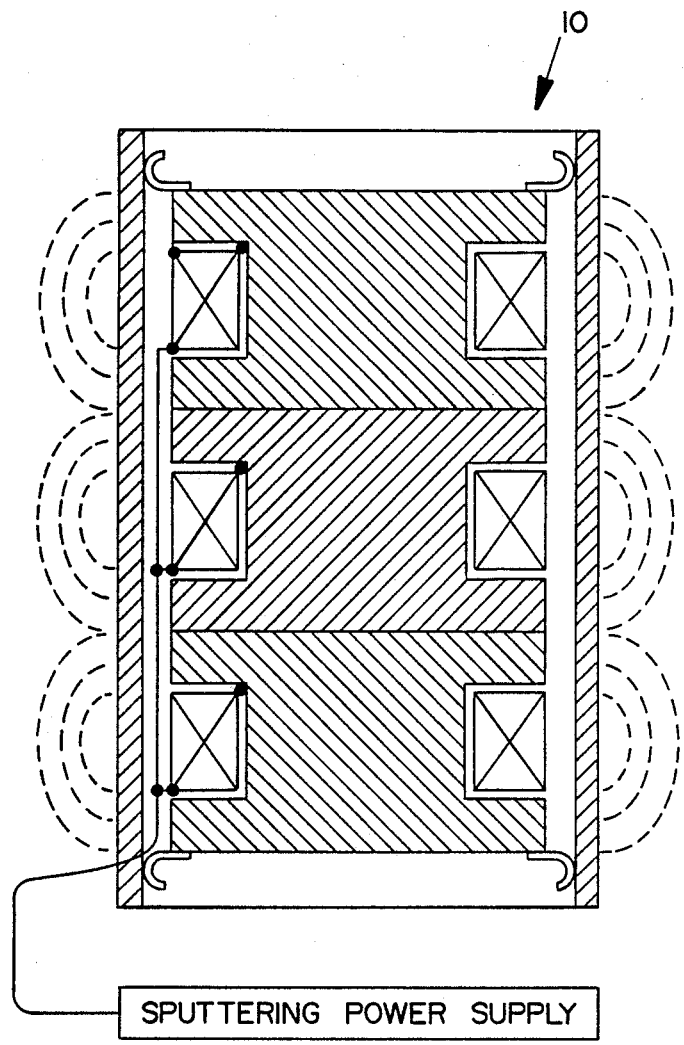

FIG. 2 illustrates a similar magnetron structure where the coils are connected in parallel. Note a top connection to the electromagnetic core and a bottom connection to the same electrical line for each coil.

MODE OF OPERATION

The transverse component of magnetic field should be in the range 100 to 600 Gauss for magnetron sputtering in electromechanical structural configurations of this general type, whether the surface is convex as in this illustration, concave or planar. The number of ampere turns needed in an electromagnet to provide this field is geometry dependent and core dependent.

In FIG. 1, when the core flanges are $T_M$" wide, the core gap 1", the coil ID 2" and the core material cold drawn steel, then a suitable field is generated when the product of the number of coil turns times the coil current is in the range 500 to 3000 ampere turns.

An operating system of approximately this type of configuration was operated at a level of 500 ampere turns per coil up to 1600 ampere turns. Below 500 ampere turns, the magnetron operation could not be sustained. The power supply output set the upper limit at 1600 ampere turns where the ion current density was about 30 mA/cm$^2$, the target voltage was 550 volts, and the coating rate for aluminum was 3000 Å/min on the ID of a 12" diameter substrate support cylinder. The actual upper limit of this magnetron sputtering source operated at one micron is in the neighborhood of 3000 ampere turns. The $I^2R$ power dissipation was only 20 watts per coil, and the coil insulation was subjected to a maximum of 20 volts.

Persons knowledgeable with respect to magnetron sputtering sources can determine from the preceding specification that any size, shape or configuration of magnetron sputtering source can be designed to incorporate electromagnets as described in the preceding discussion, and that the electric current to power these magnets will then be derived from the sputtering ion current. Knowing the size, shape and configuration of the desired sputtering source and electromagnets, the number of ampere turns needed to provide a suitable magnetic field can be determined. Thus, the product $N=nI_c$ is known, where n is the number of turns in the coil and $I_c$ is the current through the coil, the ion current or a fraction thereof. The sputtering area ($A_s$) of the target is known as is the design ion current density (j), so $I=jA_s$ is known, and therefore n is known. $n=N/fI$ where f is the fraction of the sputtering ion current passing through the coil. Since the geometry is known, the size wire can be calculated as can the voltage drop and power dissipation of each of the magnet coils. Persons knowledgeable with respect to electromagnets are aware that the wire size must be such that the coil completely fills the space left for it.

Planar magnetrons based on the theory of using electromagnets powered by the ion sputtering current have been constructed and successfully operated.

Various modifications can be made to the present invention without departing from the apparent scope hereof.

I claim:

1. Magnetron sputtering source, comprising a sputtering target and electromagnets wound, insulated and electrically connected to said target so as to require or allow the sputtering ion current, or a portion thereof, to pass through the electromagnet coils of said electromagnets, thereby enabling the electromagnets to obtain their power from the magnetron sputtering power supply.

2. Method of magnetron sputtering comprising the steps of:
   a. generating a plasma in a magnetron type structure about a sputtering target;
   b. coupling ion current from the plasma to the sputtering target; and,
   c. powering electromagnets of the magnetron with the ion currents.

3. Magnetron for sputtering comprising:
   a. magnetic core means;
   b. magnetic coil means about said magnetic core means;
   c. target means surrounding said magnetic core means and said magnetic coil means; and,
   d. means for coupling the sputtering ion current to said magnetic coil means for powering said magnetic coil means.

4. Magnetron of claim 3 wherein said coil means are connected in series.

5. Magnetron of claim 3 wherein said coil means are connected in parallel.

6. Magnetron of claim 3 wherein said magnetic coil means comprises one coil.

7. Magnetron of claim 3 wherein said magnetic coil means comprises at least two coils.

8. Magnetron of claim 3 wherein said coil means comprises a plurality of coils.

9. Magnetron of claim 3 wherein said coupling means comprises a spring contact means.

* * * * *